(12) United States Patent
Swei et al.

(10) Patent No.: US 7,961,050 B1  
(45) Date of Patent: Jun. 14, 2011

(54) INTEGRATED CIRCUITS INCLUDING AN EQUALIZER AND OPERATING METHODS THEREOF

(75) Inventors: Yuwen Swei, Fremont, CA (US); Tien-Chun Yang, San Jose, CA (US); Chih-Chang Lin, San Jose, CA (US); Chan-Hong Chern, Palo Alto, CA (US); Ming-Chieh Huang, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/706,872

(22) Filed: Feb. 17, 2010

(51) Int. Cl.  
    *H03F 3/04* (2006.01)

(52) U.S. Cl. .................. 330/304; 330/254

(58) Field of Classification Search .......... 330/304, 330/252, 254  
See application file for complete search history.

(56) References Cited

U.S. PATENT DOCUMENTS

| | | | | |
|---|---|---|---|---|
| 5,533,054 A * | 7/1996 | DeAndrea et al. | ............. | 375/286 |
| 6,710,959 B1 * | 3/2004 | Iroaga | .............................. | 360/67 |
| 7,295,072 B2 * | 11/2007 | Takaso et al. | ................. | 330/260 |
| 7,562,108 B2 | 7/2009 | Singh et al. | | |
| 7,683,720 B1 * | 3/2010 | Yehui et al. | ................... | 330/311 |

OTHER PUBLICATIONS

Lee, Jri, "A 20-Gb/s Adaptive Equalizer in 0.13-μm CMOS Technology", IEEE Journal of Solid-State Circuits, vol. 41, No. 9, Sep. 2006, pp. 2058-2066.

* cited by examiner

*Primary Examiner* — Henry K Choe  
(74) *Attorney, Agent, or Firm* — Lowe Hauptman Ham & Berner, LLP

(57) ABSTRACT

An integrated circuit includes a differential amplifier. The differential amplifier includes at least one output end. A circuit is coupled with the at least one output end of the differential amplifier. The circuit does not include a resistor-capacitor (RC) network and is configured for providing a negative impedance to the differential amplifier for adjusting a direct current (DC) gain of the integrated circuit.

20 Claims, 6 Drawing Sheets

INTEGRATED CIRCUITS INCLUDING AN EQUALIZER AND OPERATING METHODS THEREOF

FIELD OF THE DISCLOSURE

The present disclosure relates generally to the field of semiconductor circuits, and more particularly, to integrated circuits including an equalizer and operating methods thereof.

BACKGROUND OF THE DISCLOSURE

Universal Serial Bus (USB) is a standard that is established for communication between devices, such as a personal computer and a portable hard disk. The communication of the devices is through a cable. After passing through the cable, signals may decay during a high frequency operation. To compensate the signal decay, equalizers have been disposed at a receiver of each device to boost the signals during the high frequency operation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1:
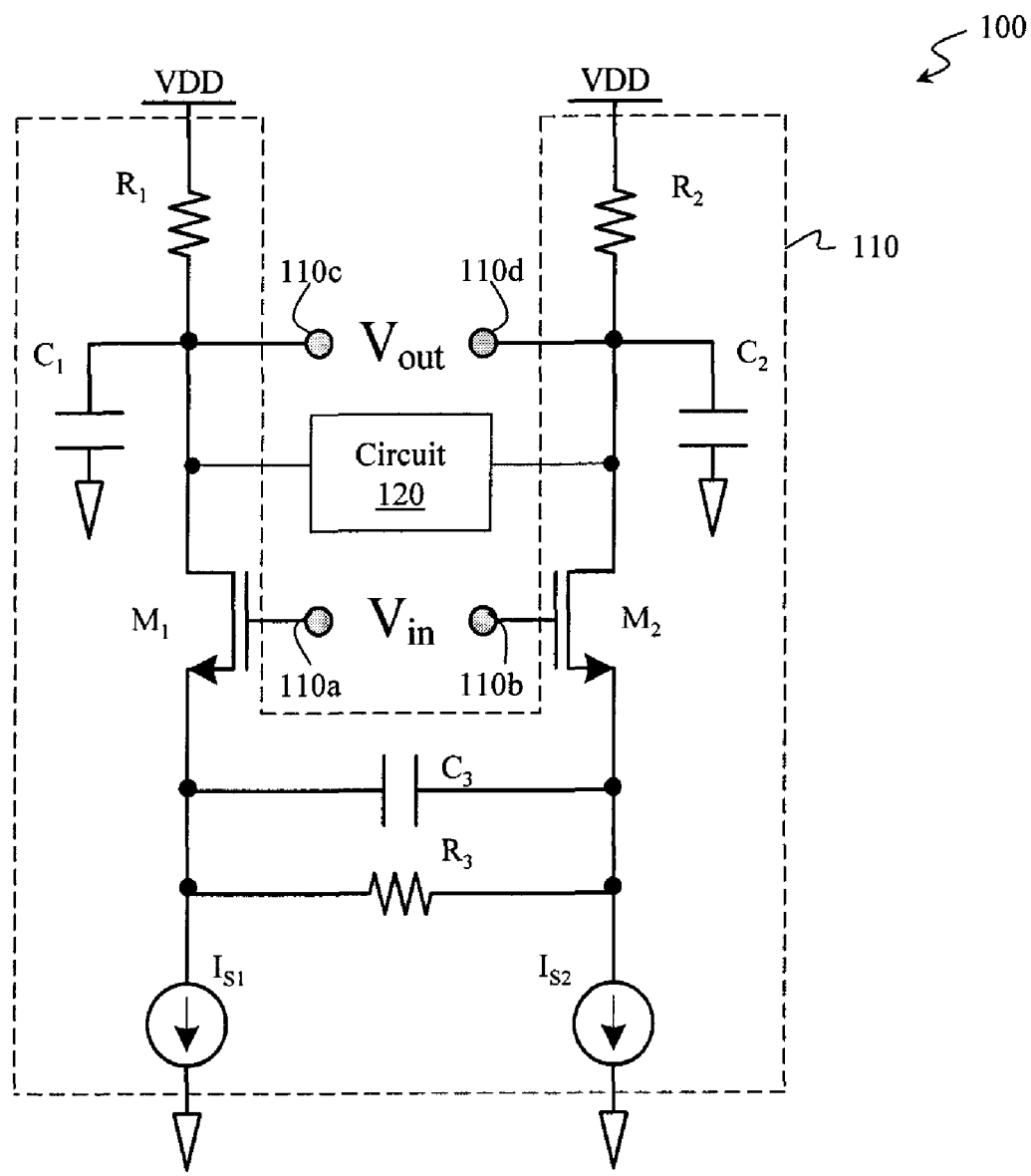
FIG. 1 is a schematic drawing illustrating an exemplary integrated circuit including a differential amplifier and a circuit that is configured to provide a negative impedance to the differential amplifier.

Conventionally, an equalizer has first resistors and first capacitors coupled to output ends of the equalizer. Each first resistor has a resistance $R_L$ and each first capacitor has a capacitance $C_L$. The equalizer further has NMOS transistors. Drains of the NMOS transistors are coupled to the output ends of the equalizer. Each source of the NMOS transistors is coupled to a current source. Gates of the NMOS transistors are coupled to input ends of the equalizer. A second resistor and a second capacitor are disposed in parallel between the NMOS transistors. The second resistor has a resistance $R_S$ and the second capacitor has a capacitance $C_S$.

The equalizer receives an input signal having an amplitude $V_{in}$ for outputting an output signal having an amplitude $V_{out}$. An equalization transfer function can be expressed as below:

$$\frac{V_{out}}{V_{in}} = \frac{g_{m1}R_L}{1 + \frac{g_{m1}R_S}{2}} \cdot \frac{1 + R_S C_S s}{\left(1 + \frac{R_S C_S s}{1 + \frac{g_{m1}R_S}{2}}\right)(1 + R_L C_L s)}$$

wherein $g_{m1}$ represents a transconductance of one of the NMOS transistors and s represents a radial frequency. A zero $w_{z1}$ is equal to $1/R_S C_S$. A real pole $w_{p1}$ is equal to $$\left(1 + \frac{g_{m1}R_S}{2}\right)/R_S C_S$$

and another real pole $w_{p2}$ is equal to $1/R_L C_L$.

Generally, currents of the current sources are adjusted to control the operation of the equalizer. It is found that the direct current (DC) gain $$\left(\frac{g_{m1}R_L}{1 + \frac{g_{m1}R_S}{2}}\right)$$

of the equalizer is substantially independent from the change of the currents. It is also found that adjusting the currents of the current sources can only change the real pole $w_{p1}$.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Embodiments of the present disclosure are directed to integrated circuits including a differential amplifier coupled with a circuit. The circuit does not include a resistor-capacitor (RC) network. The circuit can provide a negative impedance to the differential amplifier. By adjusting the negative impedance, a direct current (DC) gain of the integrated circuit can be changed. Other embodiments of the disclosure are directed to methods of operating the integrated circuit.

FIG. 1 is a schematic drawing illustrating an exemplary integrated circuit including a differential amplifier and a circuit that is configured to provide a negative impedance to the differential amplifier. In FIG. 1, an integrated circuit 100 can include a differential amplifier 110 coupled with a circuit 120. In some embodiments, the integrated circuit 100 can include an equalizer, such as a continuous-time equalizer. The integrated circuit 100 can compensate a loss of an input signal during a high-frequency operation.

Referring to FIG. 1, the differential amplifier 110 can include at least one input end, e.g., input ends 110a and 110b, and at least one output end, e.g., output ends 110c and 110d. The input ends 110a and 110b can receive an input signal that has an amplitude $V_{in}$. The output end 110c and 110d can output an output signal that has an amplitude $V_{out}$. The integrated circuit 100 can output the output signal corresponding to the input signal.

The circuit 120 can be coupled with the differential amplifier 110. In some embodiments, the circuit 120 can be coupled with the output ends 110c and 110d of the differential amplifier 110. As noted, the circuit 120 does not include a resistor-capacitor (RC) network. Without any RC network in the circuit 120, the size of the circuit 120 can be desirably reduced. It is also noted that the circuit 120 can provide a negative impedance to the differential amplifier 110 for adjusting a DC gain of the integrated circuit 100. By adjusting the DC gain, the input signal can be desirably boosted during a high-frequency operation.

In some embodiments, the differential amplifier 110 can include resistors $R_1$ and $R_2$ coupled with the output ends 110c and 110d, respectively. The resistors $R_1$ and $R_2$ can also be coupled with a voltage source, e.g., a voltage source $V_{DD}$. In some embodiments, the resistors $R_1$ and $R_2$ can be adjustable resistors. In other embodiments, the resistors $R_1$ and $R_2$ can have the same resistance. Each of the resistors $R_1$ and $R_2$ can have a resistance $R_L$.

The differential amplifier 110 can include capacitors $C_1$ and $C_2$ coupled with the output ends 110c and 110d, respectively. The capacitors $C_1$ and $C_2$ can also be coupled with a voltage source, e.g., voltage source $V_{SS}$ or ground. In some embodiments, the capacitors $C_1$ and $C_2$ can have the same capacitance. Each of the capacitors $C_1$ and $C_2$ can have a capacitance $C_L$.

The differential amplifier 110 can include transistors $M_1$ and $M_2$ coupled with the output ends 110c and 110d, respectively. In some embodiments, the transistors $M_1$ and $M_2$ can be, for example, NMOS transistors. Drain sides of the transistors $M_1$ and $M_2$ can be coupled with the output ends 110c and 110d, respectively. Gates of the transistors $M_1$ and $M_2$ can be coupled with the input ends 110a and 110b, respectively. In some embodiments, the transistors $M_1$ and $M_2$ can have the same transconductance. Each of the transistors $M_1$ and $M_2$ can have a transconductance $g_{m1}$. It is noted that the type of the transistors $M_1$ and $M_2$ described above in conjunction with FIG. 1 are merely exemplary. For example, the transistors $M_1$ and $M_2$ can be PMOS transistors.

The differential amplifier 110 can include a resistor $R_3$ and a capacitor $C_3$ coupled between the transistors $M_1$ and $M_2$. The resistor $R_3$ can be disposed in parallel with the capacitor $C_3$. In some embodiments, the resistor $R_3$ can be an adjustable resistor. The resistor $R_3$ can have a resistance $R_S$ and the capacitor $C_3$ can have a capacitance $C_S$.

Referring again to FIG. 1, the differential amplifier 110 can include at least one current source, e.g., current sources $I_{S1}$ and $I_{S2}$. The current sources $I_{S1}$ and $I_{S2}$ can be coupled with the transistors $M_1$ and $M_2$, respectively. By adjusting currents of the current sources $I_{S1}$ and $I_{S2}$, the transconductance $g_{m1}$ of the transistor $M_1$ or $M_2$ can be changed. It is noted that the differential amplifier 110 described above in conjunction with FIG. 1 is merely exemplary. Any suitable amplifier or other type differential amplifier can be used to replace the differential amplifier 110. It is also noted that the number and dispositions of the resistors, capacitors, and transistors of the differential amplifier 110 are merely exemplary. The scope of this application is not limited thereto.

Figure 2:
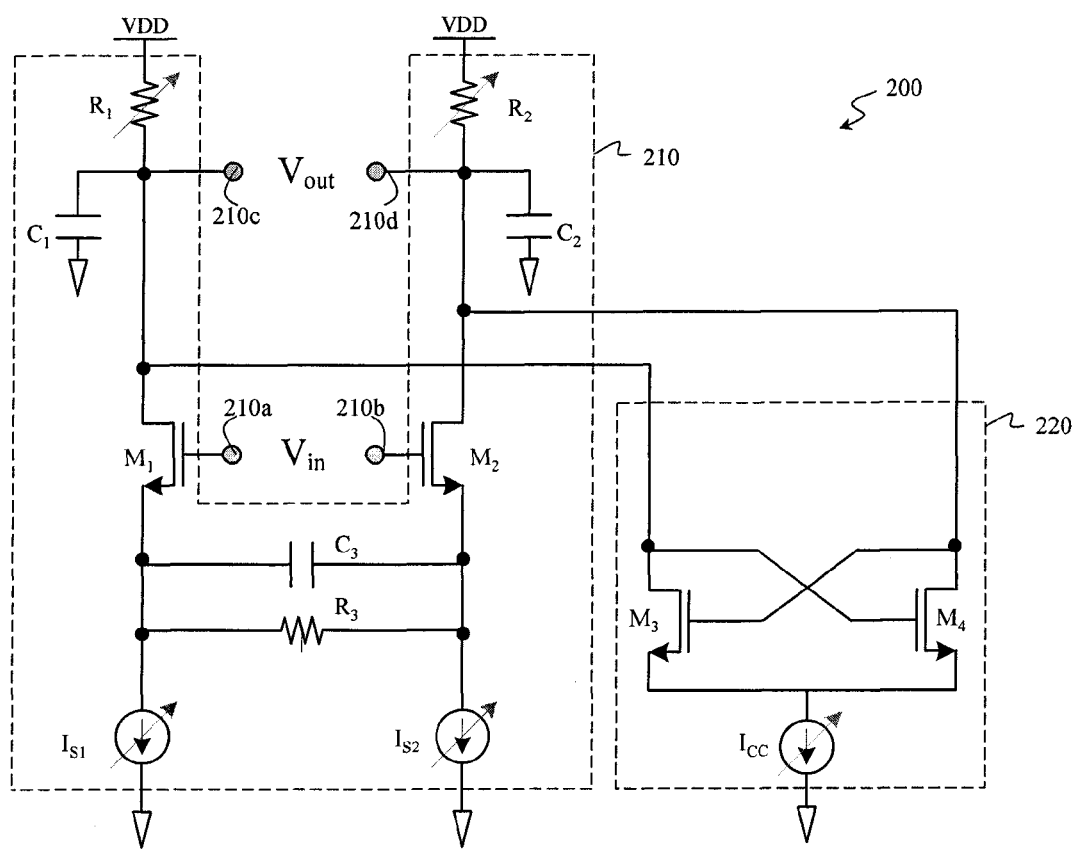
FIG. 2 is a schematic drawing illustrating another exemplary integrated circuit including a differential amplifier coupled with a pair of cross-coupled transistors.

FIG. 2 is a schematic drawing illustrating another exemplary integrated circuit including a differential amplifier coupled with a pair of cross-coupled transistors. Items of FIG. 2 that are the same or similar items in FIG. 1 are indicated by the same reference numerals, increased by 100. In FIG. 2, an integrated circuit 200 can include a differential amplifier 210 coupled with a circuit 220. In this embodiment, the circuit 220 can include a pair of cross-coupled transistors or any circuit that can provide a negative impedance to the differential amplifier 210. The pair of cross-coupled transistors can include transistors $M_3$ and $M_4$. In some embodiments, the transistors $M_3$ and $M_4$ can be NMOS transistors. Source ends of the transistors $M_3$ and $M_4$ are free from being coupled to an RC network. The transistors $M_3$ and $M_4$ can have the same transconductance $g_{m2}$. The transistors $M_3$ and $M_4$ can be disposed in parallel with the resistors $R_1$ and $R_2$, respectively. The transistors $M_3$ and $M_4$ can be coupled with output ends 210c and 210d of the differential amplifier 210, respectively. It is noted that the type of the transistors $M_3$ and $M_4$ are merely exemplary. For example, the transistors $M_3$ and $M_4$ can be PMOS transistors.

Referring again to FIG. 2, the transistors $M_3$ and $M_4$ can be coupled with only a current source $I_{CC}$. As noted, the circuit 220 does not include a resistor-capacitor (RC) network. In some embodiments, the circuit 220 essentially consists of the cross-coupled transistors and the current source $I_{CC}$. The source ends of the transistors $M_3$ and $M_4$ are directly coupled to the current source $I_{CC}$. By adjusting the current of the current source $I_{CC}$, the transconductance $g_{m2}$ of the transistors $M_3$ and $M_4$ can be adjusted. The negative impedance ($-1/g_{m2}$) of the circuit 220 applied to the differential amplifier 210 can be adjusted.

As noted, the input ends 210a and 210b can receive the input signal having the amplitude $V_{in}$. By applying the negative impedance ($-1/g_{m2}$) from the circuit 220 to the differential amplifier 210, the output ends 210c and 210d can output the output signal having the amplitude $V_{out}$. By adjusting the negative impedance, the DC gain of the integrated circuit 200 can be changed.

It is found that the amplitudes $V_{in}$ and $V_{out}$ of the input and output signals, respectively, can have a ratio ($V_{out}/V_{in}$) that can be described below in formula (1). The formula (I) can be referred to as an equalization transfer function.

$$\frac{V_{out}}{V_{in}} = \frac{g_{m1} \frac{R_L}{1-g_{m2}R_L}}{1+\frac{g_{m1}R_s}{2}} \cdot \frac{1+R_s C_s s}{\left(1+\frac{R_s C_s s}{1+\frac{g_{m1}R_s}{2}}\right)\left(1+\frac{R_L C_L s}{1-g_{m2}R_L}\right)} \quad (1)$$

Wherein, $g_{m1}$ represents the transconductance of the transistor $M_1$ or $M_2$, $g_{m2}$ represents the transconductance of the transistor $M_3$ or $M_4$, $R_L$ represents the resistance of the resistor $R_1$ or $R_2$, $R_S$ represents the resistance of the resistor $R_3$, $C_L$ represents the capacitance of the capacitor $C_1$ or $C_2$, $C_S$ represents the resistance of the capacitor $C_3$, and s represents a radial frequency.

Figure 3A:
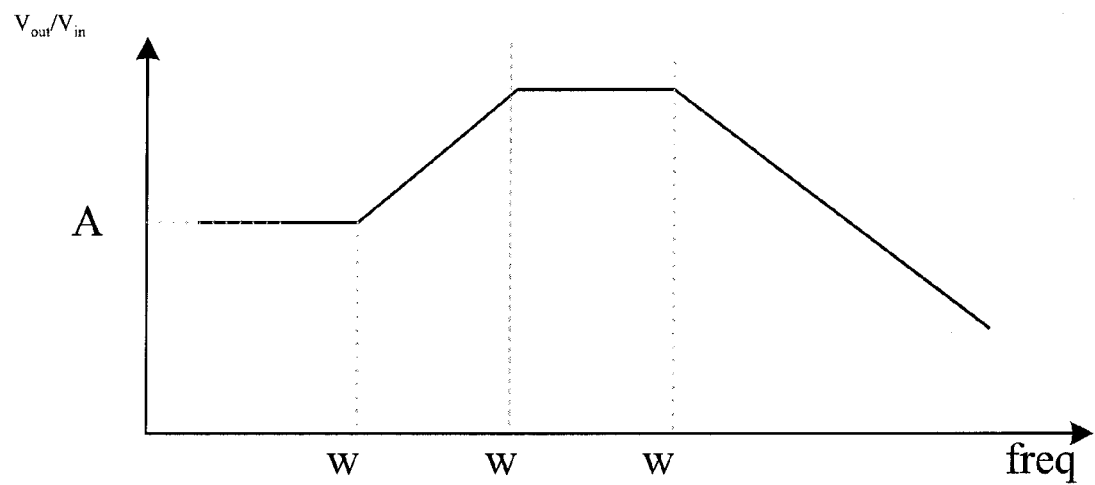
FIG. 3A is a schematic drawing showing a relationship between a signal frequency and a ratio $V_{out}/V_{in}$.

FIG. 3A is a schematic drawing showing a relationship between a signal frequency and the ratio $V_{out}/V_{in}$. In FIG. 3A, if the signal frequency is 0, the DC gain ($A_1$) of the integrated circuit 200 can be substantially equal to $$\frac{g_{m1} \frac{R_L}{1 - g_{m2} R_L}}{1 + \frac{g_{m1} R_s}{2}}.$$

The equalization transfer function has only one zero and two real poles. The equalization transfer function of the circuit 200 does not include any complex pole. The zero $w_{z1}$ can be substantially equal to $1/R_S C_S$. A real pole $w_{p1}$ can be substantially equal to $$\frac{1 + \frac{g_{m1} R_s}{2}}{R_s C_s}$$

and the other real pole $w_{p2}$ can be substantially equal to $$\frac{1 - g_{m2} R_L}{R_L C_L}.$$

As shown in FIG. 3A, the ratio $V_{out}/V_{in}$ can rise after the zero $w_{z1}$, flatten after the real pole $w_{p1}$, and decay after the real pole $w_{p2}$.

Figure 3B:
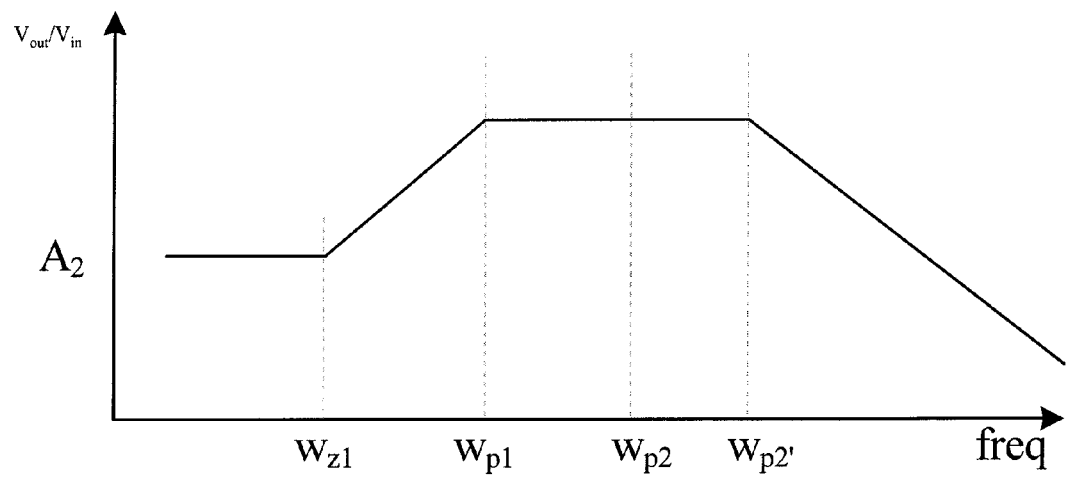
FIG. 3B is a schematic drawing showing a relationship between the signal frequency and the ratio $V_{out}/V_{in}$ if the current of the current source $I_{CC}$ is decreased.

FIG. 3B is a schematic drawing showing a relationship between the signal frequency and the ratio $V_{out}/V_{in}$ if the current of the current source $I_{CC}$ is decreased. As noted, the decrease of the current of the current source $I_{CC}$ can decrease the transconductance $g_{m2}$ of the transistors $M_3$ and $M_4$. The decrease of the transconductance $g_{m2}$ can increase the absolute value of the negative impedance ($|-1/g_{m2}|$). For example, if the transconductance of the transistors $M_3$ and $M_4$ is decreased from $g_{m2}$ to $g_{m2'}$, the negative impedance provided from the circuit 210 (shown in FIG. 2) can be increased from $|-1/g_{m2}|$ to $|-1/g_{m2'}|$.

Since the transconductance of the transistors $M_3$ and $M_4$ is decreased from $g_{m2}$ to $g_{m2'}$, the DC gain of the integrated circuit 200 can be decreased from $$\frac{g_{m1} \frac{R_L}{1 - g_{m2} R_L}}{1 + \frac{g_{m1} R_s}{2}} (A_1) \text{ to } \frac{g_{m1} \frac{R_L}{1 - g_{m2'} R_L}}{1 + \frac{g_{m1} R_s}{2}} (A_2).$$

The zero $w_{z1}$ and the real pole $w_{p1}$ are not changed since they are independent from the transconductance $g_{m2}$. The real pole $w_{p2'}$ can shift to a frequency $$\frac{1 - g_{m2'} R_L}{R_L C_L}$$

that is higher than that of the real pole $w_{p2}$.

Figure 3C:
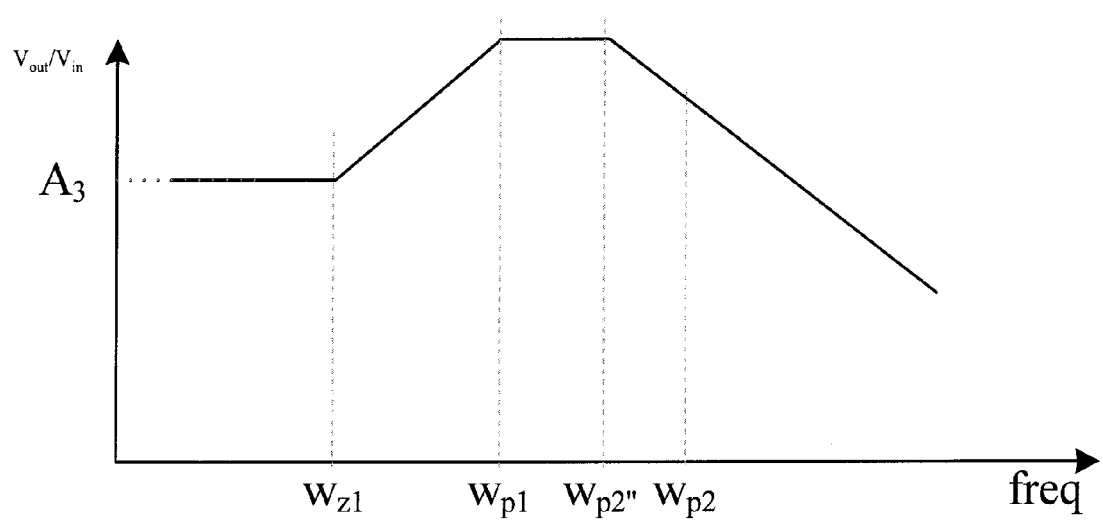
FIG. 3C is a schematic drawing showing a relationship between the signal frequency and the ratio $V_{out}/V_{in}$ if the current of the current source $I_{CC}$ is increased.

FIG. 3C is a schematic drawing showing a relationship between the signal frequency and the ratio $V_{out}/V_{in}$ if the current of the current source $I_{CC}$ is increased. The increase of the current of the current source $I_{CC}$ can increase the transconductance $g_{m2}$ of the transistors $M_3$ and $M_4$. The increase of the transconductance $g_{m2}$ can decrease the absolute value of the negative impedance ($|-1/g_{m2}|$). For example, if the transconductance of the transistors $M_3$ and $M_4$ is increased from $g_{m2}$ to $g_{m2''}$, the absolute value of the negative impedance provided from the circuit 210 can be decreased from $|-1/g_{m2}|$ to $|-1/g_{m2''}|$.

Since the transconductance of the transistors $M_3$ and $M_4$ is increased from $g_{m2}$ to $g_{m2''}$, the DC gain is increased from $$\frac{g_{m1} \frac{R_L}{1 - g_{m2} R_L}}{1 + \frac{g_{m1} R_s}{2}} (A_1) \text{ to } \frac{g_{m1} \frac{R_L}{1 - g_{m2''} R_L}}{1 + \frac{g_{m1} R_s}{2}} (A_3).$$

The zero $w_{z1}$ and the real pole $w_{p1}$ are not changed since they are independent from the transconductance $g_{m2}$. The real pole $w_{p2''}$ can shift to a frequency $$\frac{1 - g_{m2''} R_L}{R_L C_L}$$

that is lower than that of the real pole $w_{p2}$.

As noted, the DC gain of the integrated circuit 200 can be adjustable by merely changing the negative impedance provided from the circuit 210. The input signal received on the input ends 210a and 210b can be desirably boosted during a high-frequency operation. It is found that the frequency of the real pole $w_{p2}$ can be changed by adjusting the current of the current source $I_{CC}$. It is also found the frequency of the real pole $w_{p1}$ can be changed by adjusting the currents of the current sources $I_{S1}$ and $I_{S2}$. By changing the real poles $w_{p1}$ and $w_{p2}$, the bandwidth of the integrated circuit 200 can be desirably achieved.

Figure 4:
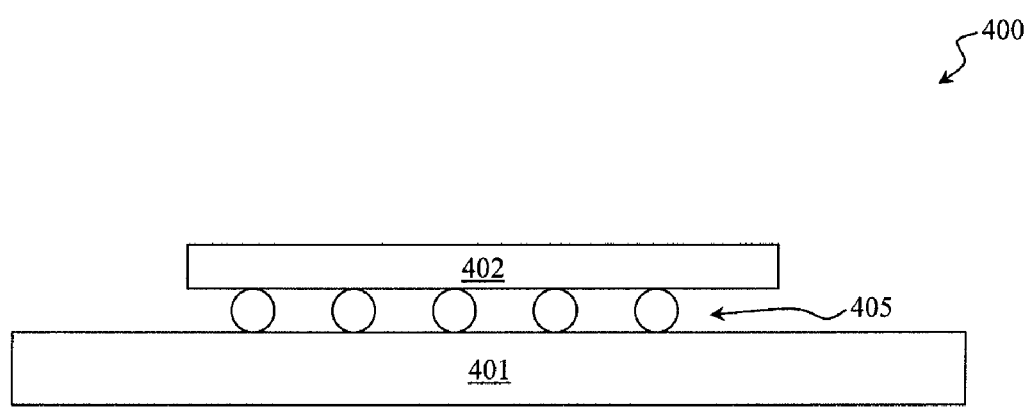
FIG. 4 is a schematic drawing illustrating a system including an exemplary integrated circuit disposed over a substrate board.

FIG. 4 is a schematic drawing illustrating a system including an exemplary integrated circuit disposed over a substrate board. In FIG. 4, a system 400 can include an integrated circuit 402 disposed over a substrate board 401. The substrate board 401 can include a printed circuit board (PCB), a printed wiring board and/or other carrier that is capable of carrying an integrated circuit. The integrated circuit 402 can be similar to the integrated circuit 100 or 200 described above in conjunction with FIGS. 1 and 2. The integrated circuit 402 can be electrically and/or thermally coupled with the substrate board 401 through bumps 405. The system 400 can be part of an electronic system such as a computer, a display, a portable device, a cell phone, an auto vehicle, an entertainment device, or the like. In some embodiments, the system 400 including the integrated circuit 402 can provide an entire system in one IC, so-called system on a chip (SOC) or system on integrated circuit (SOIC) devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a differential amplifier comprising at least one output end; and a circuit coupled with the at least one output end of the differential amplifier, wherein the circuit does not include a resistor-capacitor (RC) network and is configured for providing a negative impedance to the differential amplifier for adjusting a direct current (DC) gain of the integrated circuit.

2. The integrated circuit of claim 1, wherein the circuit comprises:
a pair of cross-coupled transistors; and
only a single first current source coupled with the pair of cross-coupled transistors.

3. The integrated circuit of claim 2, wherein the differential amplifier comprises a first resistor and a second resistor that are coupled with the at least one output end, the first resistor is parallel with a first transistor of the cross-coupled transistors, and the second resistor is parallel with a second transistor of the cross-coupled transistor.

4. The integrated circuit of claim 3, wherein the differential amplifier further comprises:
a third transistor coupled with the first resistor;
a fourth transistor coupled with the second resistor;
a first capacitor coupled with the first resistor;
a second capacitor coupled with the second resistor;
a third capacitor coupled between the third and fourth transistors;
a third resistor coupled between the third and fourth transistors; and
at least one second current source coupled with the first transistor and the second transistor.

5. The integrated circuit of claim 4, wherein the differential amplifier further comprises at least one input end coupled with gates of the third and fourth transistors, the at least one input end is configured to receive an input signal having a first amplitude $V_{in}$, the at least one output end is configured to output an output signal having a second amplitude $V_{out}$, and an equalization transfer function is:

$$\frac{V_{out}}{V_{in}} = \frac{g_{m1} \frac{R_L}{1-g_{m2}R_L}}{1+\frac{g_{m1}R_S}{2}} \cdot \frac{1+R_s C_s s}{\left(1+\frac{R_s C_s s}{1+\frac{g_{m1}R_S}{2}}\right)\left(1+\frac{R_L C_L s}{1-g_{m2}R_L}\right)}$$

wherein $g_{m1}$ represents a transconductance of the third or fourth transistors, $g_{m2}$ represents a transconductance of one of the cross-coupled transistors, $-1/g_{m2}$ represents the negative impedance, $R_L$ represents a resistance of the first or second resistor, $R_S$ represents a resistance of the third resistor, $C_L$ represents a capacitance of the first or second capacitor, $C_S$ represents a resistance of the third capacitor, and s represents a radial frequency.

6. The integrated circuit of claim 5, wherein the DC gain is capable of being reduced by reducing the transconductance $g_{m2}$.

7. The integrated circuit of claim 5, wherein the DC gain is capable of being increased by increasing the transconductance $g_{m2}$.

8. The integrated circuit of claim 5, wherein the equalization transfer function has only one zero and two real poles.

9. An integrated circuit comprising:
a differential amplifier comprising:
a first output end and a second output end;
a first resistor coupled with the first output end; and
a second resistor coupled with the second output end;
a pair of cross-coupled transistors comprising:
a first transistor coupled with the first output end;
a second transistor coupled with the second output end, wherein the first transistor is parallel with the first resistor, and the second transistor is parallel with the second resistor, wherein source ends of the first and second transistors are free from being coupled to a resistor-capacitor (RC) network; and
only a single first current source coupled with the first transistor and the second transistor.

10. The integrated circuit of claim 9, wherein the pair of cross-coupled transistors are configured for providing a negative impedance to the differential amplifier for adjusting a direct current (DC) gain of the integrated circuit.

11. The integrated circuit of claim 10, wherein the DC gain is capable of being reduced by increasing the absolute value of the negative impedance.

12. The integrated circuit of claim 10, wherein the DC gain is capable of being increased by decreasing absolute value of the negative impedance.

13. The integrated circuit of claim 10, wherein the differential amplifier further comprises:
a third transistor coupled with the first resistor;
a fourth transistor coupled with the second resistor;
a first capacitor coupled with the first resistor;
a second capacitor coupled with the second resistor;
a third capacitor coupled between the third and fourth transistors;
a third resistor coupled between the third and fourth transistors; and
at least one current source coupled with the third transistor and the fourth transistor.

14. The integrated circuit of claim 13, wherein the differential amplifier further comprises at least one input end coupled with gates of the third and fourth transistors, the at least one input end is configured to receive an input signal having a first amplitude $V_{in}$, the at least one output end is configured to output an output signal having a second amplitude $V_{out}$, and an equalization transfer function is:

$$\frac{V_{out}}{V_{in}} = \frac{g_{m1} \frac{R_L}{1-g_{m2}R_L}}{1+\frac{g_{m1}R_S}{2}} \cdot \frac{1+R_s C_s s}{\left(1+\frac{R_s C_s s}{1+\frac{g_{m1}R_S}{2}}\right)\left(1+\frac{R_L C_L s}{1-g_{m2}R_L}\right)}$$

wherein $g_{m1}$ represents a transconductance of the third or fourth transistors, $g_{m2}$ represents a transconductance of one of the cross-coupled transistors, $-1/g_{m2}$ represents the negative impedance, $R_L$ represents a resistance of the first or second resistor, $R_S$ represents a resistance of the third resistor, $C_L$ represents a capacitance of the first or second capacitor, $C_S$ represents a resistance of the third capacitor, and s represents a radial frequency.

15. A method of operating a continuous-time equalizer, the method comprising:
receiving an input signal having a first amplitude $V_{in}$ by at least one input end of a differential amplifier;
applying a negative impedance to at least one output end of the differential amplifier for adjusting a direct current (DC) gain of the continuous-time equalizer; and
outputting an output signal having a second amplitude $V_{out}$ corresponding to the first amplitude $V_{in}$ of the input signal.

16. The method of claim 15, wherein an equalization transfer function of the continuous-time equalizer is $$\frac{V_{out}}{V_{in}} = \frac{g_{m1} \frac{R_L}{1 - g_{m2}R_L}}{1 + \frac{g_{m1}R_S}{2}} \cdot \frac{1 + R_s C_s s}{\left(1 + \frac{R_s C_s s}{1 + \frac{g_{m1}R_s}{2}}\right)\left(1 + \frac{R_L C_L s}{1 - g_{m2}R_L}\right)}$$

wherein $g_{m1}$ represents a transconductance of a transistor of the differential amplifier coupled with the at least one input end, $-1/g_{m2}$ represents the negative impedance, $R_L$ represents a resistance of a first resistor of the differential amplifier coupled with the at least one output end, $R_S$ represents a resistance a second resistor of the differential amplifier coupled with the transistor, $C_L$ represents a capacitance of a first capacitor of the differential amplifier coupled with the at least one output end, $C_S$ represents a resistance of a second capacitor of the differential amplifier coupled with the transistor, and s represents a radial frequency.

17. The method of claim 15, wherein the equalization transfer function only has one zero and two real poles.

18. The method of claim 15, wherein the equalization transfer function does not include any complex pole.

19. The method of claim 15, wherein applying the negative impedance to the at least one output end of the differential amplifier for adjusting the second amplitude $V_{out}$ of the output signal comprises:

reducing the DC gain by increasing the absolute value of the negative impedance.

20. The method of claim 15, wherein applying the negative impedance to the at least one output end of the differential amplifier for adjusting the second amplitude $V_{out}$ of the output signal comprises:

increasing the DC gain by decreasing the absolute value of the negative impedance.

* * * * *